(12) United States Patent
French, Jr. et al.

(10) Patent No.: US 9,173,304 B2
(45) Date of Patent: Oct. 27, 2015

(54) VERTICAL BLINDMATE SCALING OF IDENTICAL SYSTEM BOARDS

(71) Applicant: International Business Machines Corporation, Armonk, NY (US)

(72) Inventors: Michael D. French, Jr., Raleigh, NC (US); Edward J. McNulty, Raleigh, NC (US); Tony C. Sass, Fuquay Varina, NC (US); Paul A. Wormsbecher, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 300 days.

(21) Appl. No.: 13/945,560

(22) Filed: Jul. 18, 2013

(65) Prior Publication Data
US 2015/0022990 A1 Jan. 22, 2015

(51) Int. Cl.
*H05K 3/36* (2006.01)
*H01R 12/73* (2011.01)
*H01R 12/70* (2011.01)

(52) U.S. Cl.
CPC ............ *H05K 3/368* (2013.01); *H01R 12/7082* (2013.01); *H05K 2201/042* (2013.01); *H05K 2201/10189* (2013.01); *H05K 2201/10325* (2013.01)

(58) Field of Classification Search
CPC ... H05K 3/368; H05K 2201/042; H01R 12/73
USPC .......................................... 361/786, 790, 792
See application file for complete search history.

(56) References Cited

U.S. PATENT DOCUMENTS

| | | | |
|---|---|---|---|
| 4,853,830 A | * 8/1989 | Corfits et al. | 361/725 |
| 5,211,566 A | * 5/1993 | Bates et al. | 439/66 |
| 5,215,471 A | 6/1993 | Reymond et al. | |
| 5,645,434 A | 7/1997 | Leung | |
| 5,980,299 A | * 11/1999 | Davis | 439/377 |
| 6,014,313 A | 1/2000 | Hesselbom | |
| 6,109,929 A | 8/2000 | Jasper | |

(Continued)

FOREIGN PATENT DOCUMENTS

| JP | 4269483 A | 9/1992 |
|---|---|---|
| JP | 200369180 A | 3/2003 |

OTHER PUBLICATIONS

Fujitsu Siemens Computers GmbH "PRIMERGY BX630—Scalable Server-Blade Options Guide", Edition Feb. 2006, 146 pages.

(Continued)

*Primary Examiner* — Jeremy C Norris
*Assistant Examiner* — Nathan Milakovich
(74) *Attorney, Agent, or Firm* — Katherine S. Brown; Jeffrey L. Streets (57) ABSTRACT

Two system boards may be connected by a blind plug connector assembly. The top system board supports a first connector and has a hole adjacent the first connector that secures a guide bracket. The blind plug connector assembly is selectively received in the guide bracket to position a proximal connector on the assembly for connecting to the first connector on the top system board and position a distal connector on the assembly for connecting to a second connector on the lower system board. A flexible wired connection extends within the assembly between the proximal connector and the distal connector, and may form a scalability cable. The interaction between the assembly and the guide bracket provide alignment of the connectors.

19 Claims, 7 Drawing Sheets

(56) References Cited

U.S. PATENT DOCUMENTS

| | | | | |
|---|---|---|---|---|
| 6,142,802 | A * | 11/2000 | Berg et al. | 439/180 |
| 6,231,385 | B1 * | 5/2001 | Kuo | 439/557 |
| 6,771,514 | B1 * | 8/2004 | Elg | 361/786 |
| 6,791,843 | B1 * | 9/2004 | Dobbs et al. | 361/758 |
| 7,044,745 | B2 | 5/2006 | Reinhardt et al. | |
| 7,297,015 | B1 * | 11/2007 | Desrosiers et al. | 439/377 |
| 7,458,144 | B2 * | 12/2008 | Barina et al. | 29/794 |
| 7,690,927 | B1 | 4/2010 | Kerrigan et al. | |
| 7,920,389 | B2 * | 4/2011 | Tang et al. | 361/803 |
| 8,189,347 | B2 | 5/2012 | Mukouyama | |
| 8,743,562 | B2 * | 6/2014 | Hartman et al. | 361/792 |
| 2004/0072453 | A1 | 4/2004 | Stillabower et al. | |
| 2004/0257777 | A1 * | 12/2004 | Barsun et al. | 361/752 |
| 2006/0216965 | A1 | 9/2006 | Yamanashi et al. | |
| 2006/0285807 | A1 * | 12/2006 | Lu et al. | 385/92 |
| 2012/0008298 | A1 | 1/2012 | Courselle et al. | |
| 2013/0135833 | A1 * | 5/2013 | Chen et al. | 361/752 |
| 2013/0311817 | A1 * | 11/2013 | Kim et al. | 713/501 |
| 2014/0156986 | A1 * | 6/2014 | Sun | 713/100 |

OTHER PUBLICATIONS

Fujitsu Siemens Computers GmbH "PRIMERGY BX630—Scalable Server-Blade Options Guide", Edition Jul. 2006, 153 pages.
Fujitsu Ltd, "Electronic Part Mounting Socket", English Abstract JP04-269483 A, Sep. 25, 1992, 1 page.
Canon, "Flexible Printed Board and Electronic Equipment", English Abstract JP2003-069180 A, Mar. 7, 2003, 1 page.

* cited by examiner

VERTICAL BLINDMATE SCALING OF IDENTICAL SYSTEM BOARDS

BACKGROUND

1. Field of the Invention

The present invention relates to interconnections for scaling system boards.

2. Background of the Related Art

Processors may be interconnected to achieve greater performance. The greater performance may include faster memory access or increased data handling capacity. An interconnection between two or more processors may be referred to as a bus, such as with the front side bus (FSB), or a point to point interconnect, such as with the Intel Corporation's QUICKPATH INTERCONNECT (QPI). When an interconnection is made between processors, the processors are referred to as being scaled and a cable used to complete the interconnection is referred to as a scalability cable.

Processor scalability requires a high signal quality electrical connection between the processors. When the processors being scaled are mounted on the same circuit board, such electrical connection may be made with conductive traces that extend from the socket for one processor to the socket for another processor. However, when the processors being scaled are located in different housings, the electrical connection must allow for mechanical compliance of each housing. For example, mechanical compliance is required to allow each housing to be properly inserted into a chassis and also to resist damage from shock and vibration.

BRIEF SUMMARY

One embodiment of the present invention provides an apparatus, comprising a first printed circuit board having a first connector and a hole directly adjacent the first connector, and a second printed circuit board that is parallel to and located below the first printed circuit board, wherein the second printed circuit board has a second connector that is not aligned with the hole through the first printed circuit board. The apparatus further comprises a guide bracket secured in the hole and extending orthogonally through the hole, wherein the guide bracket includes first and second slots extending from an upper edge of the guide bracket to a lower edge of the guide bracket on opposing sides of the guide bracket. Still further, the apparatus comprises a blind plug cable assembly having a housing with a proximal end, a distal end and a tapered central portion between the proximal and distal ends, wherein the proximal end secures a proximal connector for connecting to the first connector on the first printed circuit board, the distal end secures a distal connector for connecting to the second connector on the second printed circuit board, a flexible wired connection extends between the proximal connector and the distal connector, the distal end and distal connector fit through the guide bracket, and the tapered central portion has first and second side pins that engage and pass within the first and second slots of the guide bracket from the upper edge to the lower edge to move the distal connector into alignment with the second connector on the second printed circuit board as the central portion of the assembly moves through the guide bracket toward the second printed circuit board, and the proximal end is sized to engage the guide bracket and assure axial alignment of the assembly and the guide bracket as the proximal connector connects with the first connector and the distal connector connects with the second connector.

DETAILED DESCRIPTION

One embodiment of the present invention provides an apparatus, comprising a first printed circuit board having a first connector and a hole directly adjacent the first connector, and a second printed circuit board that is parallel to and located below the first printed circuit board, wherein the second printed circuit board has a second connector that is not aligned with the hole through the first printed circuit board. The apparatus further comprises a guide bracket secured in the hole and extending orthogonally through the hole, wherein the guide bracket includes first and second slots extending from an upper edge of the guide bracket to a lower edge of the guide bracket on opposing sides of the guide bracket. Still further, the apparatus comprises a blind plug cable assembly having a housing with a proximal end, a distal end and a tapered central portion between the proximal and distal ends, wherein the proximal end secures a proximal connector for connecting to the first connector on the first printed circuit board, the distal end secures a distal connector for connecting to the second connector on the second printed circuit board, a flexible wired connection extends between the proximal connector and the distal connector, the distal end and distal connector fit through the guide bracket, and the tapered central portion has first and second side pins that engage and pass within the first and second slots of the guide bracket from the upper edge to the lower edge to move the distal connector into alignment with the second connector on the second printed circuit board as the central portion of the assembly moves through the guide bracket toward the second printed circuit board, and the proximal end is sized to engage the guide bracket and assure axial alignment of the assembly and the guide bracket as the proximal connector connects with the first connector and the distal connector connects with the second connector.

In a further embodiment, the distal connector is secured to a spring loaded member extending from the assembly. The spring loaded member preferably has a spring preload force that is equal to or greater than the insertion force required to connect the distal connector to the second connector. The spring loaded member may also have a range of distal motion to allow for a range of distances between the first and second printed circuit boards, in which case the flexible wired connection may have sufficient length to extend between the proximal and distal connectors over the range of distances between the first and second printed circuit boards. The spring loaded member will preferably allow the distal connector and the second connector to remain connected over a range of variations in the distance between the first and second printed circuit board. Still further, the distal connector may connect to the second connector before the proximal connector connects to the first connector.

In another embodiment, the first and second slots include an angled portion that angles downward and in the direction of the first socket on the first printed circuit board. Preferably, the slot has an upper end that begins at the upper edge of the guide bracket at a distance from a back wall of the guide bracket that causes the distal connector to be aligned with the guide bracket, and a lower end that ends at the lower edge of the guide bracket at a distance from a front wall of the guide bracket that cause the distal connector to be aligned with the second socket.

An additional embodiment of the apparatus includes a latch on the opposing sides of the assembly for latching the assembly to the guide bracket with the proximal connector connected to the first connector and the distal connector connected to the second connector. For example, the latch may comprise a tab that is outwardly biased to snap into a window in the guide bracket. Furthermore, the latch may be retracted and released by pressing a button coupled to the tab in order to overcome the bias and draw the tab inwardly to release the latch.

In yet another embodiment, the first printed circuit board is secured in a first chassis and the second printed circuit board is secured in a second chassis. A hole through a lower wall of the first chassis and a hole through a directly adjacent upper wall of the second chassis are aligned with the bracket through the first printed circuit board, and the hole in the first chassis and the hole in the second chassis are sized to allow the assembly to extend there through without engaging the assembly. Optionally, an alignment feature may be provided for securing the first and second chassis together in alignment, wherein alignment of the first and second chassis aligns the hole through the lower wall of the first chassis with the hole through the directly adjacent upper wall of the second chassis.

In a further embodiment, the second connector includes a guide pin for aligning a connector housing of the distal connector with a connector housing of the second connector. Separately or in combination with the guide pin, the connector housing of the second connector may mate with the connector housing of the distal connector for the purpose of aligning a plurality of conductors of the distal connector with a plurality of conductors of the second connector.

In one embodiment, the proximal connector, the distal connector and the wired connections between the proximal and distal connectors establish a quickpath interconnect. Other connector types may be similarly implemented. It should also be recognized that any two connectors that intended to be connected together, might be referred to as a socket and a plug. While the first or second connector on the first or second printed circuit board, respectively, may be a socket for connecting with a plug on the assembly, the proximal and distal connectors on the assembly may alternatively include a socket for connecting with a plug on the first or second printed circuit board.

One embodiment of the guide bracket includes outwardly extending flexible tabs for securing the guide bracket to the first printed circuit board.

In a still further embodiment, the first printed circuit board has four connectors or socket units and the second printed circuit board has four connectors or socket units. For example, two of the connectors may be side-by-side on the first printed circuit board and two of the connectors may be side-by-side on the second printed circuit board. Such an apparatus may further include a second hole directly adjacent the side-by-side sockets on the first printed circuit board, wherein the side-by-side sockets on the second printed circuit board are not aligned with the second hole. This apparatus may further include a second guide bracket secured in a second hole, wherein the guide bracket includes first and second slots extending from an upper edge of the guide bracket to a lower edge of the guide bracket on opposing sides of the guide bracket. A second blind plug cable assembly may have a housing with a proximal end, a distal end and a tapered central portion between the proximal and distal ends, wherein the proximal end secures a pair of proximal connectors for connecting to the two side-by-side sockets on the first printed circuit board, the distal end secures a pair of distal connectors for connecting to the two side-by-side sockets on the second printed circuit board, a first flexible wired connection extends between a proximal connector on a first side of the second assembly and a distal connector on the first side of the second assembly, a second flexible wired connection extends between a proximal connector on a second side of the second assembly and a distal connector on the second side of the second assembly, the distal end and the pair of distal connectors fit through the second guide bracket, and the tapered central portion has first and second side pins that engage and pass within the first and second slots of the second guide bracket from the upper edge to the lower edge to move the pair of distal connectors into alignment with the side-by side sockets on the second printed circuit board as the central portion of the assembly moves through the second guide bracket toward the second printed circuit board, and the proximal end is sized to engage the second guide bracket and assure axial alignment of the second assembly and the second guide bracket as the pair of proximal connectors connect with the side-by-side sockets on the first printed circuit board and the pair of distal connectors connect with the side-by-side sockets on the second printed circuit board.

Figure 1:
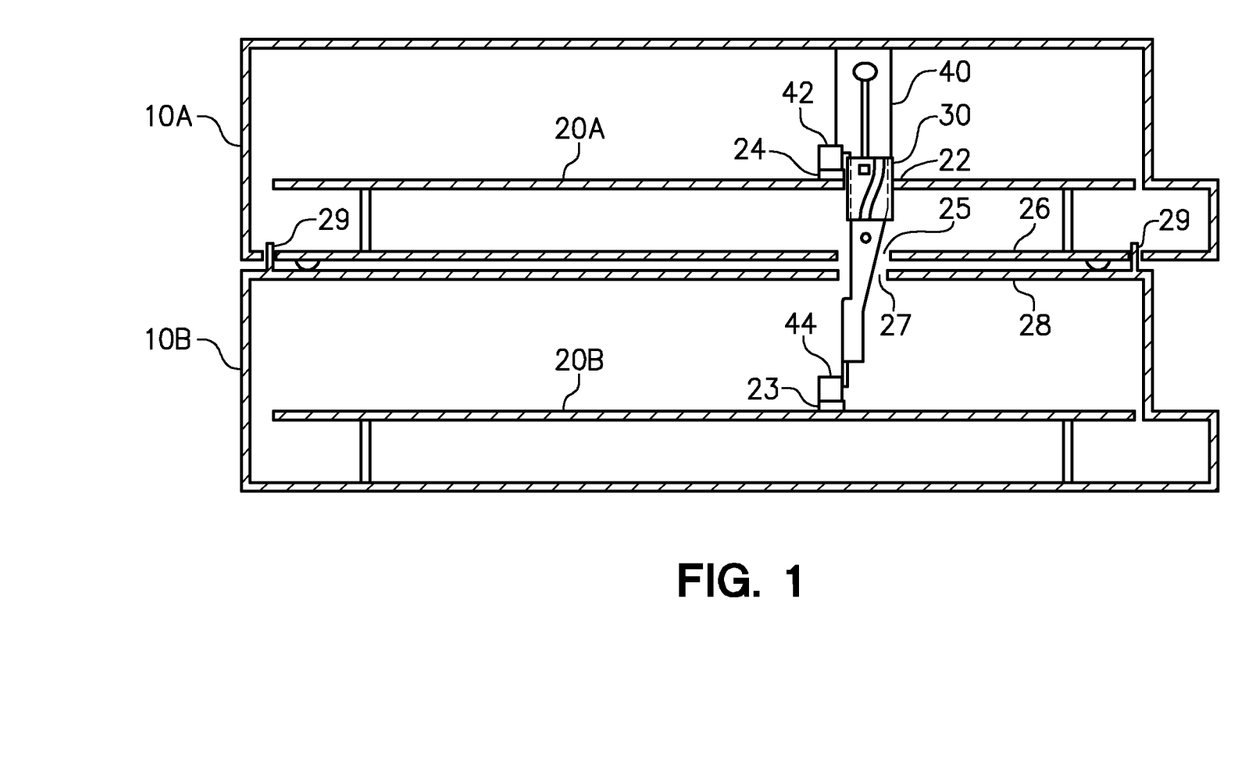
FIG. 1 is a schematic side view of two interconnected system boards.

FIG. 1 is a schematic side view of two interconnected system boards. A first printed circuit board 20A is secured in a first chassis 10A and a second printed circuit board 20B is secured in a second chassis 10B. The first printed circuit board 20A has a hole 22 directly adjacent to a first connector 24 and a guide bracket 30 secured in the hole and extending orthogonally to the first printed circuit board 20A. The second printed circuit board 20B may be identical to the first printed circuit board 20A for convenience or efficiency, but this is not necessary. However, the second printed circuit board 20B must have a second connector 23.

The first chassis 10A also has a hole 25 through a lower wall 26 and the second chassis 10B has a hole 27 through an upper wall 28, wherein the holes 25, 27 are generally aligned with the guide bracket 30 of the first printed circuit board 20A and are sized to allow a blind plug cable assembly 40 to extend there through without engaging the assembly. Optionally, alignment features 29 may be provided for securing the first and second chassis together in alignment, wherein alignment of the first and second chassis 20A, 20B aligns the hole 25 through the lower wall 26 of the first chassis with the hole 27 through the directly adjacent upper wall 28 of the second chassis.

The blind plug cable assembly 40 secured a proximal connector 42 for connecting to the first connector 24 on the first printed circuit board and a distal connector 44 for connecting to the second connector 23 on the second printed circuit board.

Figure 2:
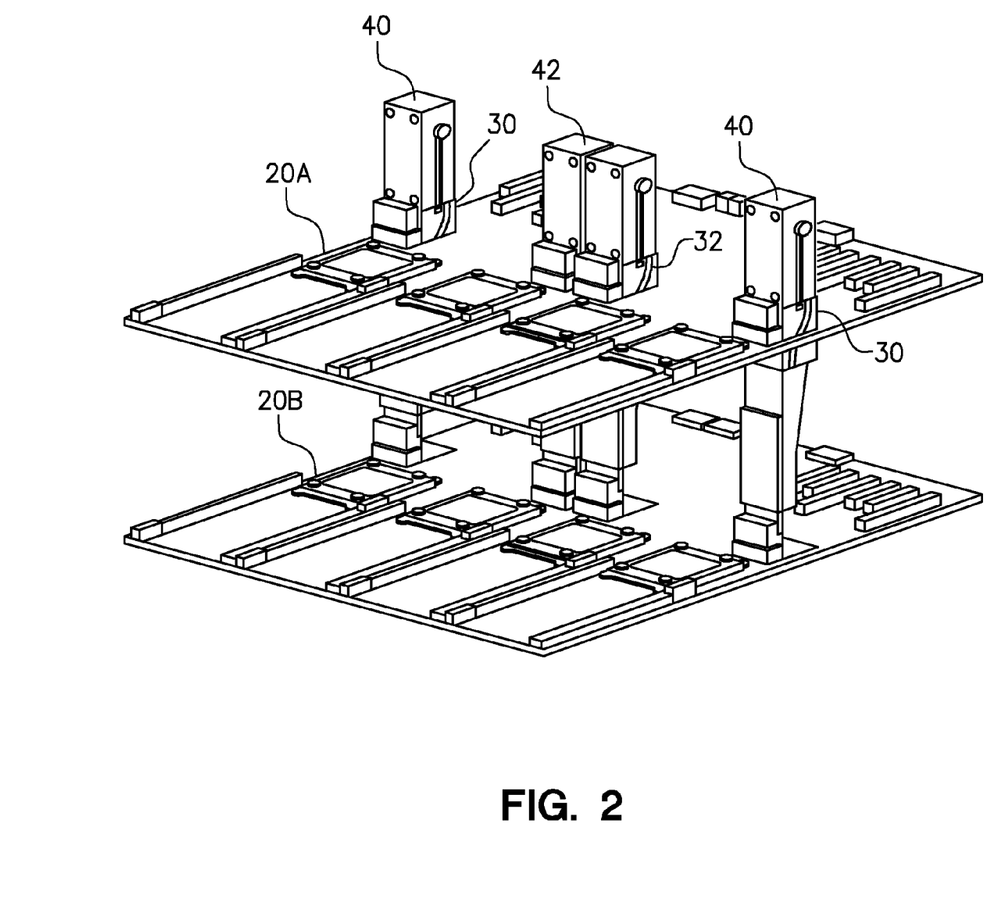
FIG. 2 is a perspective view of two system boards connected by a blind plug cable assembly.

FIG. 2 is a perspective view of two system boards 20A, 20B connected by a blind plug cable assembly 40. In the embodiment shown, there are multiple blind plug cable assemblies that are used to convert two standard 4-socket system boards 20A, 20B into an 8-socket server using native QPI links. The two 4-socket system boards may be installed in a rack within a slide mount server chassis (See FIG. 1). The system includes two straight links 40 and one cross-link 42 (the double wide central part). Although the double wide link 42 may include two straight links in a common housing, the double wide link 42 is preferably a cross-link that may give the best performance by allowing any two processors to communication with no more than two links (i.e., only one processor therebetween). The blind plug cable assemblies 40, 42 reach the installed position (as shown) by inserting the assemblies downwardly through the guide brackets 30, 32, which requires a top cover of the first chassis 10A (See FIG. 1) to be removed. Upon insertion and latching of the assemblies 40, 42, the first (upper) chassis' cover would be re-installed and the two chassis could then be slid into an operational position in the rack.

Referring to FIGS. 1 and 2, it can be seen that the assemblies 40, 42 provide the shortest path possible between two points on the system boards 20A, 20B. This is important because system board wire or trace routing/length, connector selection and cable length are major contributors to the noise imparted on the signal. The short distance of the assemblies 40, 42 allows a high data transfer rates without a loss of signal integrity as might occur using blind mate deep plug cabling that comes from the back of the chassis. Furthermore, the blind plug cable assemblies 40, 42 can be easily removed to allow relative motion between the first and second chassis for service of the lower system, such as CPU add/replacement, memory replacement, PCIe boards, and the like.

Figure 3:
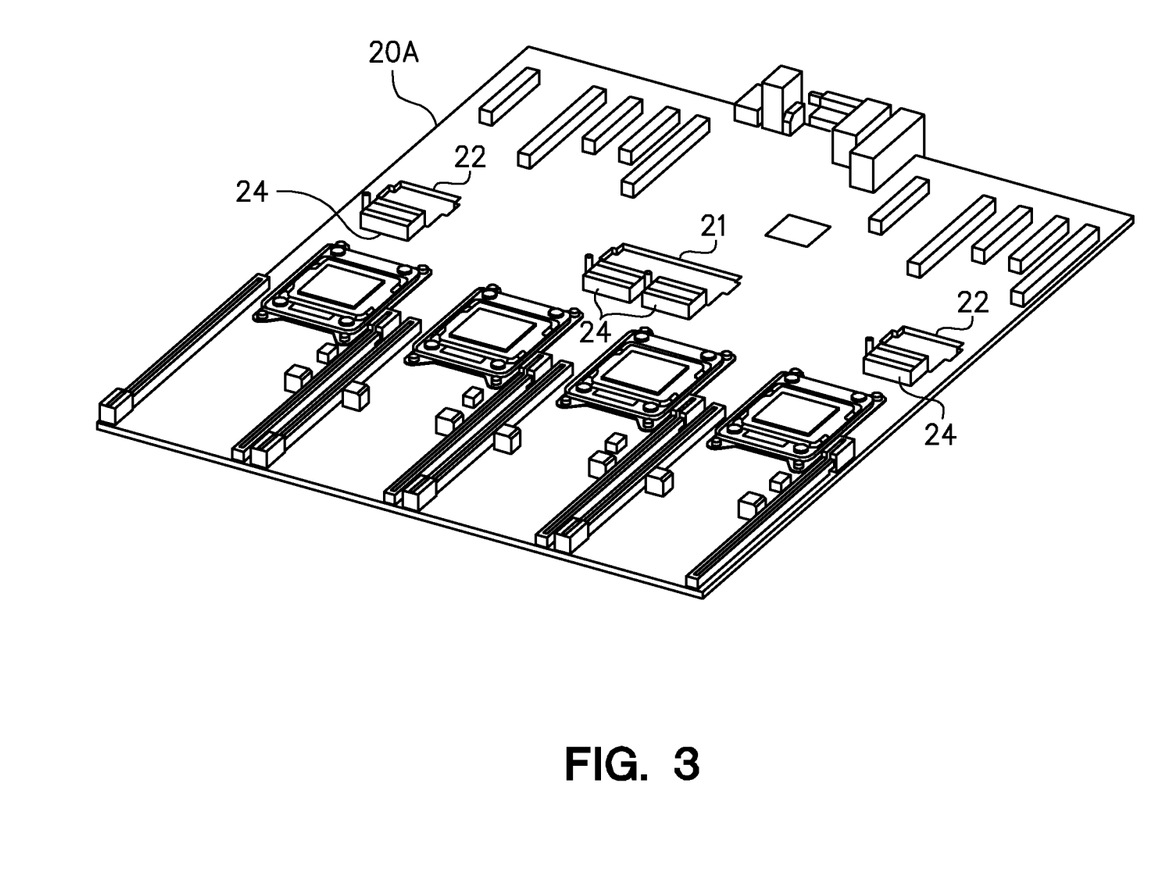
FIG. 3 is a perspective view of a single system board consistent with one embodiment of the present invention.

FIG. 3 is a perspective view of a single system board 20A consistent with one embodiment of the present invention. The system board may be used in both the upper (first) and lower (second) chassis, but only the upper board 20A is required to have the holes 22, 21. The holes 22, 21 are sized receive a guide bracket (not shown) and positioned on the system board 20A directly adjacent one a connector 24. The (single-wide) holes 22 are adjacent a single connector 24 and the (double-wide) hole 21 is adjacent two connectors 24. The double-wide hole may differ from the single-wide hole only in width, a double-wide guide bracket may differ from a single wide guide bracket only in width, and a double-wide blind plug cable assembly may be functionally the same as two of the single-wide blind plug cable assemblies.

Figure 4:
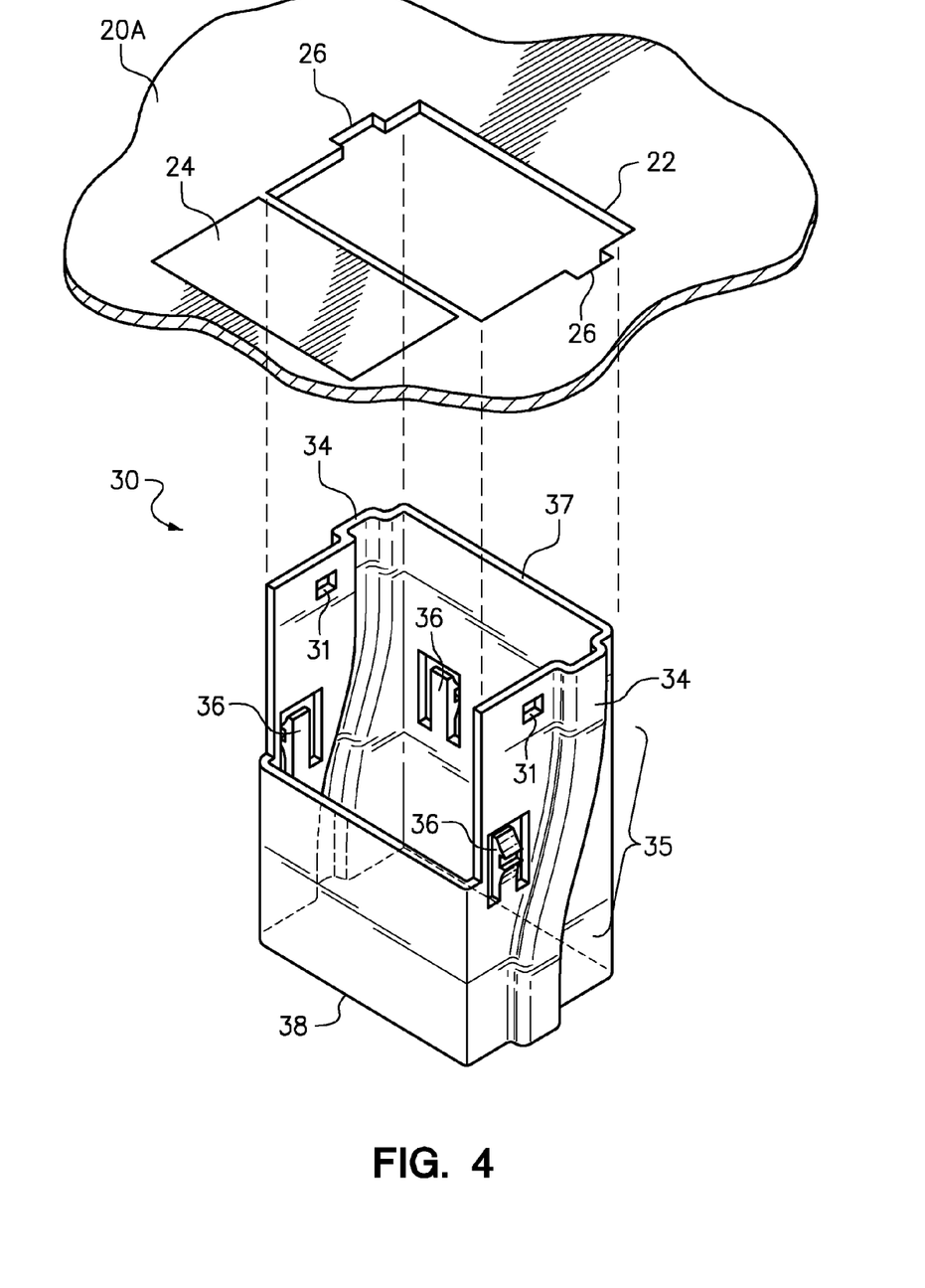
FIG. 4 is perspective view of a guide bracket aligned for insertion into a hole through the printed circuit board.

FIG. 4 is perspective view of a guide bracket 30 aligned for insertion into a hole 22 through the printed circuit board 20A. An outline 24 represents the adjacent position of a connector that is not shown in order to focus on the hole 22 and the guide bracket 30. The hole 22 and guide bracket 30 are sized so that the guide bracket is closely received within the hole. The two slots 34 may protrude from the opposing sides of the otherwise rectangular profile of the guide bracket 30, but may also be accommodated by two opposing notches 26 in the hole 22. The guide bracket 30 includes a plurality of flexible outwardly directed latches 36 around the perimeter of the guide bracket that allow the guide bracket to "snap" into place. A ramped surface allows the latch 36 to flex inwardly until the edge of the hole in the printed circuit board is received into the central channel of the latch. The central channel in the latch 36 should be sized to hold the guide bracket firmly in place, orthogonal to the printed circuit board 20A, without shifting around within the hole 22.

The slots 34 are symmetrical and include an angled portion 35 that angles downward and in the direction of the first connector 24 (leftward in FIG. 4) on the first printed circuit board. The slot has an upper end that begins at the upper edge of the guide bracket 30 at a distance from a back wall 37 of the guide bracket that causes the distal connector of the assembly (not show) to be aligned with the guide bracket 30. The slot has a lower end that ends at the lower edge of the guide bracket 30 at a distance from a front wall 38 of the guide bracket that causes the distal connector to be aligned with the second socket. This will be shown in greater detail in reference to FIGS. 7A-7D.

Figure 5:
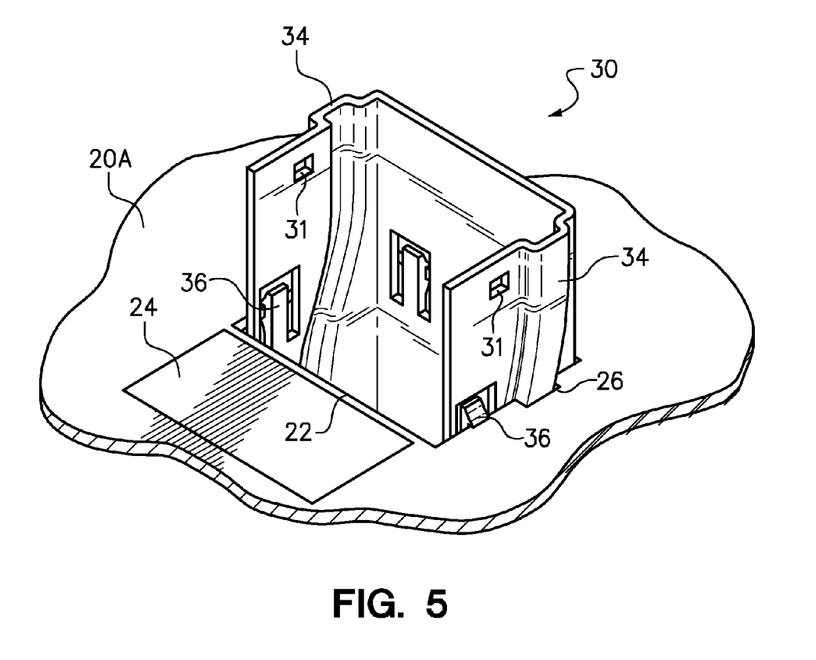
FIG. 5 is perspective view of the upper half of the guide bracket that has been secured to the printed circuit board.

FIG. 5 is perspective view of the upper half of the guide bracket 30 that has been secured to the printed circuit board 20A. The latches 36 have received the printed circuit board 20A and hold the guide bracket 30 in place. Also, the slots 34 pass through the notches 26. Note that the upper half of the guide bracket 30 is missing the side that is directly adjacent to the first connector 24.

Figure 6A:
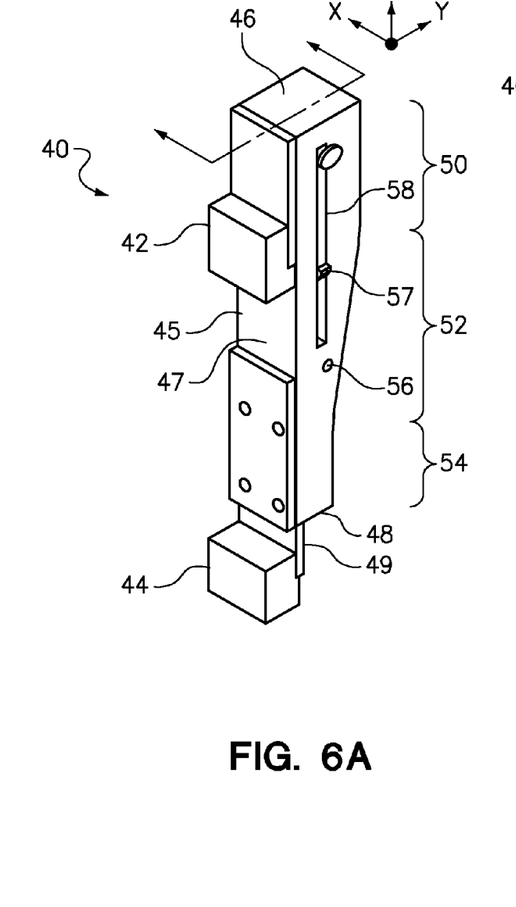
FIGS. 6A and 6B are perspective and cross-sectional side views, respectively, of a blind plug cable assembly.

FIG. 6A is a perspective view of a blind plug cable assembly 40. The assembly includes a rigid housing 45 that defines a proximal end 46 and a distal end 48. A proximal connector 42 is secured directly to the housing 45 and a distal connector 44 is secured to a sliding member 49. The sliding member 49 is allowed to retract into the housing 45 under a force, as is described in more detail with reference to FIG. 6B.

The housing 45 has a uniform width (X dimension) along its length (Z dimension) so that the connectors 42, 44 are always aligned in the X direction as dictated by the position of the hole 22 and the guide bracket 30 (See FIG. 2). However, the profile of the housing 45 in the Y dimension is not uniform. In the embodiment shown, a front face 47 of the housing 45 secures the connectors 42, 44 and may be generally straight, although the front face does not need to be flat. Rather, the front is designed to position the connectors 42, 44 in alignment with the connectors on the system boards. However, a back face (opposite the front face 47) of the housing 45 has a proximal portion 50 with a rectangular profile matching the inside profile of the guide bracket (see guide bracket 30 of FIG. 5), a middle portion 52 that is angled relative to the proximal portion 50, and a distal portion 54 that can have any profile that does not prevent the distal connector 44 and distal portion 54 from passing through the guide bracket. The housing 45 also supports a pair of guide pins 56 that are symmetrically positioned on opposite sides (X dimension) of the housing for aligning the connectors 42, 44 with the connectors on the system boards. Finally, the housing 45 preferably supports a pair of opposing latches 58 that are used to retain the housing 45 of the assembly 40 in an installed position. The functioning of the foregoing features are described in greater detail with reference to FIG. 6B and FIGS. 7A-7D.

Figure 6B:
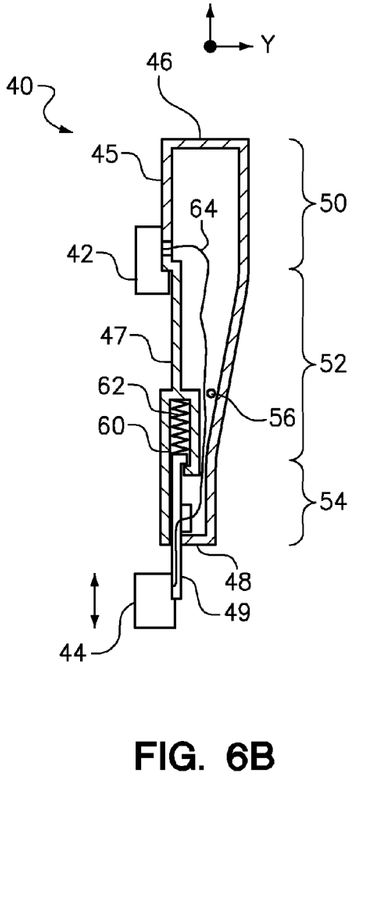

FIG. 6B is a cross-sectional side view of the blind plug cable assembly 40 of FIG. 6A. Many of the elements of the assembly 40, discussed in reference to FIG. 6A, are shown in FIG. 6B and labeled with the same reference numbers. However, this view emphasizes the profile of the back surface of the housing 45, which includes the uniform profile of the proximal portion 50, the angled profile of the middle portion 52, and the narrow profile of the distal portion 54. Furthermore, the distal connector 44 is shown secured to the sliding member 49 extending from the distal end 48 of the housing 45. The sliding member 49 is retained in a track 60 that runs parallel to the axis of the distal connector 44. A spring 62 biases the sliding member 49 to the distal end of its movement within the track 60. Under a sufficient force, the spring 62 may be compressed and allow the sliding member 49 to move in a proximal direction within the track. Preferably, the spring 62 has a spring preload force that is equal to or greater than the insertion force of the distal connector 44 into the connector on the second printed circuit board.

The proximal connector 42 and the distal connector 44 are electronically connected by a flexible wiring connection 64 that has sufficient slack to accommodate the full range of movement that the sliding member 49 may experience. Upon insertion of the assembly 40 through the guide bracket, the distal connector 44 will fully seat with the connector on the lower printed circuit board, and then the proximal connector 42 will seat with the connector on the upper printed circuit board to complete the connection between the two boards. The latches 58 secured the assembly in the installed position and prevent the proximal connector 42 from being disconnected. Any vertical motion between the two chassis (and the boards) is easily tolerated with no significant motion within the connector interface with the distal connector 44 due to the spring loaded sliding member 44. For example, shipping and earthquakes may cause out of phase vertical motion that can be accommodated by the assembly 40. In accordance with one embodiment, the connectors 42, 44 and the flexible wiring connection 64 serve as a scalability cable, which may be a QPI cable.

Figure 7A:
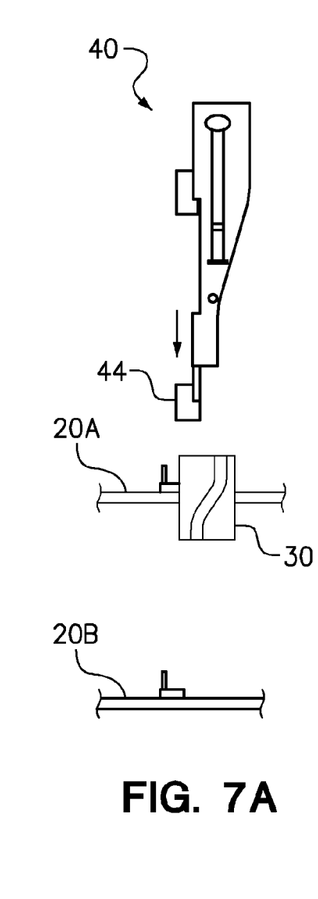
FIGS. 7A-7D are schematic side views showing the process of connecting a blind plug cable assembly between two system boards.
Figure 7B:
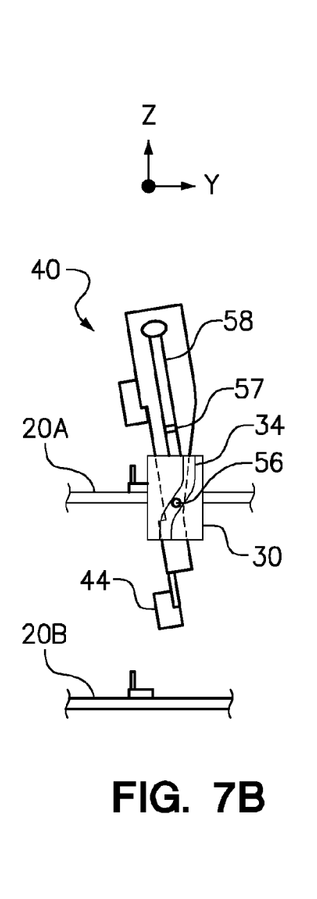
Figure 7C:
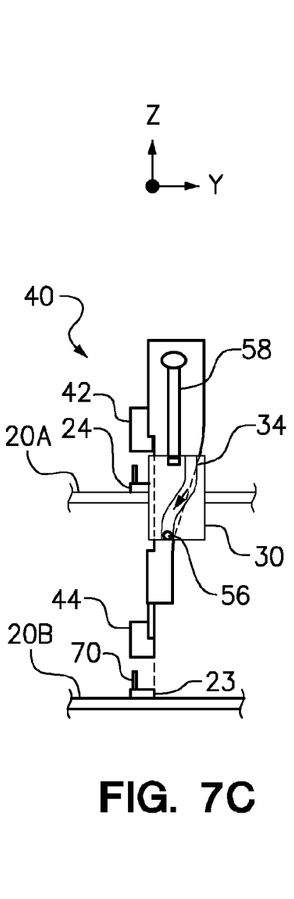
Figure 7D:
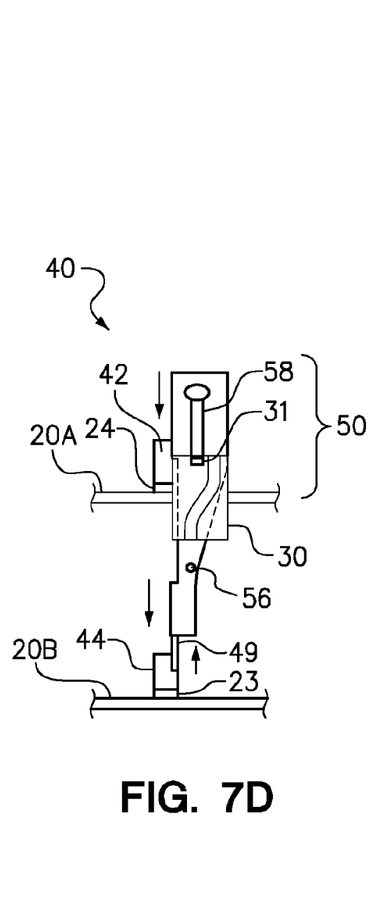

FIGS. 7A-7D are schematic side views showing the process of connecting a blind plug cable assembly 40 between two system boards 20A, 20B. FIG. 7A is a schematic view of the assembly 40 in preparation for the distal connector 44 to be inserted through the guide bracket in the first (upper) system board 20A. FIG. 7B is a schematic view of the assembly 40 with the distal connector and narrow distal end of the assembly inserted through the guide bracket 30 in the system board 20A and with the pins 56 (one shown) engaged in the upper end of the slots 34 (one shown) in the bracket 30. Note that the distance between the pin 56 and the angled portion 52 of the back of the housing 45 in combination with the position of the upper end of the slot 34 cause the assembly 40 to tilt at an angle relative to vertical in the Y direction. FIG. 7C is a schematic view of the assembly 40 having advanced further through the guide bracket 30 than in FIG. 7B, such that the pins 56 ride to the distal end of the slot 34 and align the distal connector 44 and the second (lower) connector 23 in the Y direction (front to back). FIG. 7D is a schematic view of the assembly 40 after the pin 56 has exited the bottom of the slot 34 in the guide bracket and the wider proximal portion 50 of the assembly is now fully engaged in the guide bracket 30 so that the assembly is maintained in a relatively vertical orientation. As the assembly continues downward (from the position in FIG. 7C), a guide pin 70 (See FIG. 7C) on the connector 23 of the lower system board 20B will engage the distal connector 44 and provide rough alignment of the housings of the connectors 44, 23. The connector housings themselves will engage and may be responsible for the final fine alignment of the conductive elements in the connectors. Once in this installed position of FIG. 7D, a tab 57 on the latches 58 snap into the windows 31 in a guide bracket 30.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
a first printed circuit board having a first connector and a hole directly adjacent the first connector;
a second printed circuit board that is parallel to and located below the first printed circuit board, wherein the second printed circuit board has a second connector that is not aligned with the hole through the first printed circuit board;
a guide bracket secured in the hole and extending orthogonally through the hole, wherein the guide bracket includes first and second slots extending from an upper edge of the guide bracket to a lower edge of the guide bracket on opposing sides of the guide bracket;
a blind plug cable assembly having a housing with a proximal end, a distal end and a tapered central portion between the proximal and distal ends, wherein the proximal end secures a proximal connector for connecting to the first connector on the first printed circuit board, the distal end secures a distal connector for connecting to the second connector on the second printed circuit board, a flexible wired connection extends between the proximal connector and the distal connector, the distal end and distal connector fit through the guide bracket, and the tapered central portion has first and second side pins that engage and pass within the first and second slots of the guide bracket from the upper edge to the lower edge to move the distal connector into alignment with the second connector on the second printed circuit board as the central portion of the assembly moves through the guide bracket toward the second printed circuit board, and the proximal end is sized to engage the guide bracket and assure axial alignment of the assembly and the guide bracket as the proximal connector connects with the first connector and the distal connector connects with the second connector.

2. The apparatus of claim 1, wherein the distal connector is secured to a spring loaded member extending from the assembly.

3. The apparatus of claim 2, wherein the spring loaded member has a spring preload force that is equal to or greater than the insertion force required to connect the distal connector to the second connector.

4. The apparatus of claim 2, wherein the spring loaded member has a range of distal motion to allow for a range of distances between the first and second printed circuit boards.

5. The apparatus of claim 4, wherein the flexible wired connection has sufficient length to extend between the proximal and distal connectors over the range of distances between the first and second printed circuit boards.

6. The apparatus of claim 4, wherein the spring loaded member allows the distal connector and the second connector to remain connected over a range of variations in the distance between the first and second printed circuit board.

7. The apparatus of claim 4, wherein the distal connector connects to the second connector before the proximal connector connects to the first connector.

8. The apparatus of claim 1, wherein the first and second slots include an angled portion that angles downward and in the direction of the first connector on the first printed circuit board, wherein the slot has an upper end that begins at the upper edge of the guide bracket at a distance from a back wall of the guide bracket that causes the distal connector to be aligned with the guide bracket, and wherein the slot has a lower end that ends at the lower edge of the guide bracket at a distance from a front wall of the guide bracket that cause the distal connector to be aligned with the second connector.

9. The apparatus of claim 1, further comprising:
a latch on the opposing sides of the assembly for latching the assembly to the guide bracket with the proximal connector connected to the first connector and the distal connector connected to the second connector.

10. The apparatus of claim 9, wherein the latch comprises a tab that is outwardly biased to snap into a window in the guide bracket.

11. The apparatus of claim 1, wherein the first printed circuit board is secured in a first chassis and the second printed circuit board is secured in a second chassis, and wherein a hole through a lower wall of the first chassis and a hole through a directly adjacent upper wall of the second chassis are aligned with the bracket through the first printed circuit board, wherein the hole in the first chassis and the hole in the second chassis are sized to allow the assembly to extend there through without engaging the assembly.

12. The apparatus of claim 11, further comprising:
an alignment feature for securing the first and second chassis together in alignment, wherein alignment of the first and second chassis aligns the hole through the lower wall of the first chassis with the hole through the directly adjacent upper wall of the second chassis.

13. The apparatus of claim 1, wherein the second connector includes a guide pin for aligning a connector housing of the distal connector with a connector housing of the second connector.

14. The apparatus of claim 13, wherein the connector housing of the second connector mates with the connector housing of the distal connector for aligning a plurality of conductors of the distal connector with a plurality of conductors of the second connector.

15. The apparatus of claim 1, wherein the proximal connector, the distal connector and the flexible wired connections between the proximal and distal connectors establish a quick-path interconnect.

16. The apparatus of claim 1, wherein the guide bracket includes outwardly extending flexible tabs for securing the guide bracket to the first printed circuit board.

17. The apparatus of claim 1, wherein the first printed circuit board has four connectors and the second printed circuit board has four connectors.

18. The apparatus of claim 17, wherein two of the connectors are side-by-side on the first printed circuit board and two of the connectors are side-by-side on the second printed circuit board.

19. The apparatus of claim 18, further comprising:
a second hole directly adjacent the side-by-side connectors on the first printed circuit board, wherein the side-by-side connectors on the second printed circuit board are not aligned with the second hole;
a second guide bracket secured in a second hole, wherein the guide bracket includes first and second slots extending from an upper edge of the guide bracket to a lower edge of the guide bracket on opposing sides of the guide bracket;
a second blind plug cable assembly having a housing with a proximal end, a distal end and a tapered central portion between the proximal and distal ends, wherein the proximal end secures a pair of proximal connectors for connecting to the two side-by-side connectors on the first printed circuit board, the distal end secures a pair of distal connectors for connecting to the two side-by-side connectors on the second printed circuit board, a first flexible wired connection extends between a proximal connector on a first side of the second assembly and a distal connector on the first side of the second assembly, a second flexible wired connection extends between a proximal connector on a second side of the second assembly and a distal connector on the second side of the second assembly, the distal end and the pair of distal connectors fit through the second guide bracket, and the tapered central portion has first and second side pins that engage and pass within the first and second slots of the second guide bracket from the upper edge to the lower edge to move the pair of distal connectors into alignment with the side-by side connectors on the second printed circuit board as the central portion of the assembly moves through the second guide bracket toward the second printed circuit board, and the proximal end is sized to engage the second guide bracket and assure axial alignment of the second assembly and the second guide bracket as the pair of proximal connectors connect with the side-by-side connectors on the first printed circuit board and the pair of distal connectors connect with the side-by-side connectors on the second printed circuit board.

* * * * *